(12) United States Patent
Kastner et al.

(10) Patent No.: US 6,603,164 B2
(45) Date of Patent: Aug. 5, 2003

(54) INTEGRATED SEMICONDUCTOR MEMORY CONFIGURATION

(75) Inventors: Marcus Kastner, Ottobrunn (DE); Thomas Mikolajick, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/036,034

(22) Filed: Dec. 31, 2001

(65) Prior Publication Data

US 2002/0153553 A1 Oct. 24, 2002

(30) Foreign Application Priority Data

Dec. 29, 2000 (DE) .......................... 100 65 664

(51) Int. Cl.[7] .......................... H01L 21/8142
(52) U.S. Cl. ................ 257/296; 257/301; 257/310
(58) Field of Search .................. 257/295, 296, 257/301, 303, 306, 310, 311, 535, 906, 908; 361/301.2, 301.4, 303

(56) References Cited

U.S. PATENT DOCUMENTS

| 4,959,709 A | | 9/1990 | Watanabe .................... 257/304 |
| 4,978,635 A | | 12/1990 | Watanabe .................... 438/246 |
| 5,920,785 A | * | 7/1999 | Chi et al. .................... 257/306 |

FOREIGN PATENT DOCUMENTS

| DE | 2 037 261 | 2/1971 |
| DE | 38 40 559 A1 | 6/1989 |
| DE | 39 14 055 A1 | 10/1990 |

* cited by examiner

Primary Examiner—Minh Loan Tran
Assistant Examiner—Thomas L Dickey
(74) Attorney, Agent, or Firm—Lawrence A. Greenberg; Werner H. Stemer; Ralph E. Locher

(57) ABSTRACT

The integrated ferroelectric or DRAM semiconductor memory configuration has memory cells each with a selection transistor and a capacitor module that can be addressed by the selection transistor. The capacitors of successive memory cells are formed alternately on the front and rear sides of a substrate wafer.

6 Claims, 1 Drawing Sheet

US 6,603,164 B2

INTEGRATED SEMICONDUCTOR MEMORY CONFIGURATION

BACKGROUND OF THE INVENTION

Field of the Invention

The invention lies in the integrated technology field. More specifically, the invention relates to an integrated ferroelectric or DRAM semiconductor memory configuration, in which a selection transistor and a storage capacitor which can be addressed by the selection transistor are provided on a substrate wafer per memory cell.

A DRAM semiconductor memory configuration of this type is disclosed in U.S. Pat. Nos. 4,959,709 and 4,978,635, and in the corresponding German patent application DE 38 40 559 A1.

The magnitude of the switchable polarization or the charge that can be stored on the capacitor plates is of crucial importance for the functionality and also the reliability of ferroelectric memories (FeRAMS) and DRAMs having a high dielectric constant ($\in$). The voltage on the bit line (BL) which is caused by the polarization or charge during reading must not fall below a minimum value specified for the product. In the simplest case, the BL signal can be increased by enlarging the capacitor area. However, this is accompanied by an enlargement of the chip area.

Attempts have already been made to achieve the BL signal through a suitable choice of the dielectric or ferroelectric (high dielectric constant $\in$), reduction of the thickness of the dielectric, and also by means of design optimizations (low BL capacitance). However, technological limits are imposed on these methods, and the conventional pursuits therefore, lead to the enlargement of the capacitor area at the expense of the packing density.

The semiconductor memory device disclosed in the above-noted prior art disclosures (U.S. Pat. Nos. 4,959,709, 4,978,635, and DE 38 40 559 A1) above has a storage capacitor formed as a trench capacitor in a trench formed from the rear side of a silicon substrate.

SUMMARY OF THE INVENTION

It is accordingly an object of the invention to provide an integrated ferroelectric or DRAM semiconductor memory configuration, which overcomes the above-mentioned disadvantages of the heretofore-known devices and methods of this general type and which makes available an enlarged capacitor area for each memory cell, and thus enables an increase in the switchable polarization or the charge that can be stored on the capacitor plates in order to increase the BL signal without reducing the packing density of the memory cells.

With the foregoing and other objects in view there is provided, in accordance with the invention, an integrated semiconductor memory configuration, such as a ferroelectric or a DRAM memory configuration, comprising:

a substrate having a front side and a rear side;

a plurality of memory cells each having a selection transistor and a storage capacitor connected to and addressible by the selection transistor;

the storage capacitors of respectively successive memory cells being formed alternately on the front side and the rear side of the substrate; and plugs formed on the rear side of the substrate, the plugs electrically connecting an electrode region of a respective the selection transistor with a capacitor plate, facing toward the selection transistor, of the storage capacitor disposed on the rear side of the substrate.

In accordance with an added feature of the invention, the rear side of the substrate is formed with a depression and an insulating layer formed in the depression, and wherein the storage capacitors formed on the rear side are disposed in the insulating layer and the insulating layer protects the storage capacitors from an influence of subsequent processes.

In accordance with an additional feature of the invention, the selection transistors of the memory cells are CMOS transistors formed from the front side of the substrate wafer.

In accordance with a concomitant feature of the invention, the storage capacitors formed on the front side of the substrate extend in a lateral direction to partly overlap a selection transistor of the adjacent the memory cell.

In other words, every other storage capacitor is formed on the rear side of the wafer. As a result, the storage capacitors can occupy a larger capacitance-forming area, which has an effective consequence in terms of increasing the corresponding read signal. Moreover, plugs are formed on the rear side of the substrate wafer, which plugs electrically connect an electrode region of the associated selection transistor to the capacitor plate, facing toward the selection transistor, of the storage capacitor situated on the rear side of the substrate wafer.

By incorporating the rear side of the wafer, it is possible to achieve more effective utilization of the chip area. Consequently, with no loss of chip area, the capacitor area can be made larger than in conventional technologies in which only the front side of the wafer is utilized. By virtue of the increased BL signal, the cell size can be miniaturized still further and the reliability of the memory product can be increased.

Applying semiconductor circuits to the front and rear sides of a silicon wafer is known, as described in German published patent application DE 39 14 055 A1. By means of that known two-sided process of the silicon wafer, however, a functionally continuous circuit is not applied from both sides of the silicon wafer, but rather a multiplicity of circuits which are functionally isolated from one another. This is done in the prior art in order to increase the number of semiconductor functions that can be realized per unit area.

Other features which are considered as characteristic for the invention are set forth in the appended claims.

Although the invention is illustrated and described herein as embodied in an integrated semiconductor memory configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
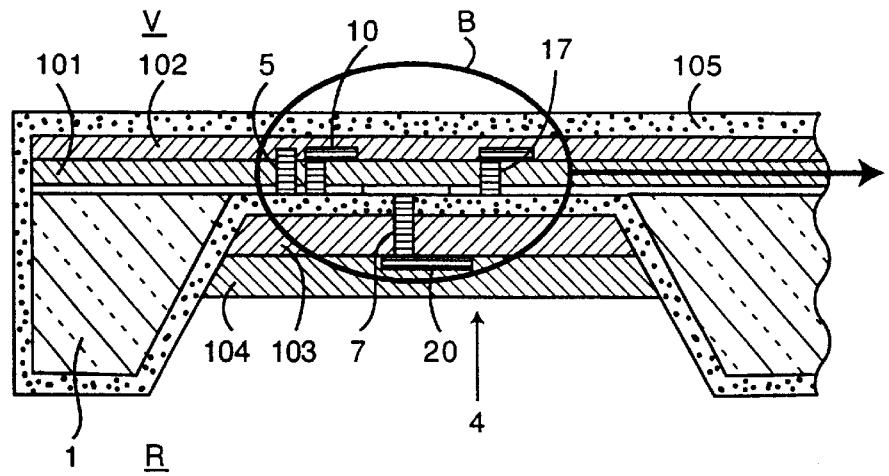
FIG. 1A is a diagrammatic section a segment of a ferroelectric or DRAM semiconductor memory configuration according to the invention.

Referring now to the figures of the drawing in detail and first, particularly, to FIG. 1A thereof, there is shown a cross section of a segment of a ferroelectric or DRAM semiconductor memory configuration. Insulator or barrier layers 101 and 102 are situated on the front side V of a substrate wafer 1. Elements of the ferroelectric or DRAM semiconductor memory configuration are provided in the layers 101, 102, such as non-illustrated interconnects, for example bit lines, plugs 17, storage capacitors 10, and non-illustrated selection transistors. The elements are formed by a CMOS-FEOL process, for example.

A first storage capacitor 10 of a first memory cell is situated on the front side V and the next storage capacitor 20 of the adjacent memory cell is situated on a rear side R of the substrate wafer 1. The fabrication of the capacitors from the front and rear sides V, R can be carried out either sequentially or by parallel processing of both sides V and R.

In order to form the capacitors 20 on the rear side R, a depression 4 is etched from the rear side R of the substrate wafer 1 by means of an anisotropic etching process. A barrier layer 105 is subsequently deposited. Insulator layers 103 and 104 and a semiconductor layer 106 are then formed in the depressions 4 on the rear side R. The capacitors 20 and, for electrically contact-connecting the latter to the selection transistors formed from the front side V, plugs 7 are formed in said layers 103 and 104. The plugs 7 pass through the barrier layer 105 right into the layer 101 containing the CMOS selection transistors.

A commonly assigned German patent application, DE 100 65 669, entitled "Method for fabricating an integrated semiconductor memory configuration" and filed concurrently with the German application upon which priority under §119 is claimed herein, relates to a method for fabricating an integrated semiconductor memory configuration. That text describes details of a fabrication process of storage capacitors for ferroelectric memories or DRAM memories on the rear side of the wafer. It is explained for the fabrication process described therein, too, that the storage capacitors can be fabricated on the front and rear sides of the substrate wafer either sequentially or by parallel processing of both sides of the wafer, in which case, in the case of parallel processing of both sides of the wafer, as many layers and elements as possible are formed simultaneously on both sides of the wafer. The disclosure of that application is herein incorporated by reference.

Figure 1B:
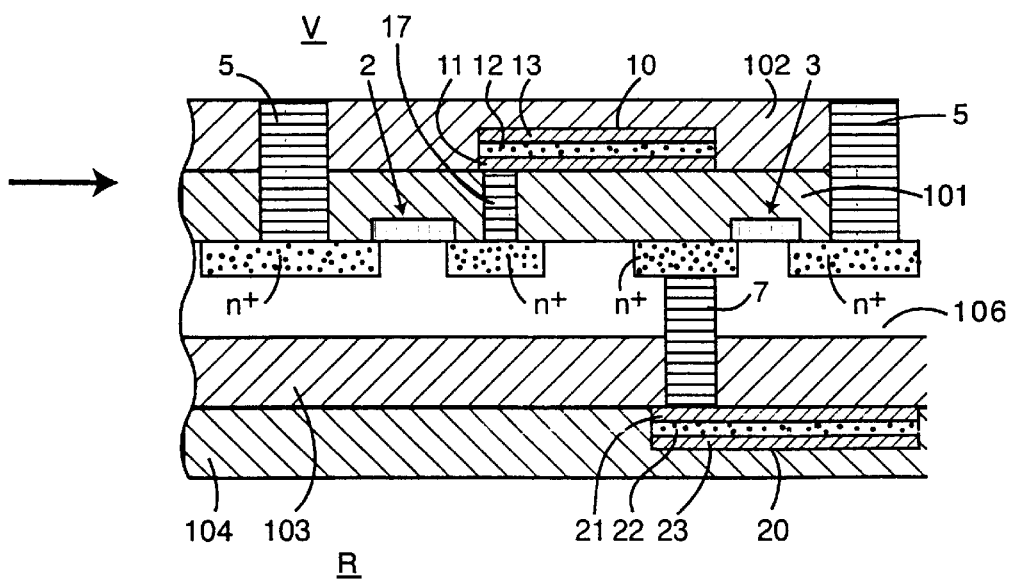
FIG. 1B is a diagrammatic section of an enlarged detail of the segment of the memory configuration inside the detail line B in FIG. 1.

The detail B of FIG. 1A which is illustrated enlarged in FIG. 1B shows that the capacitors 10, 20 which are formed on the front and rear sides V, R of the wafer 1 and are connected to selection transistors 2 and 3 by the plugs 17 and 7 in each case have capacitor plates 11, 13 and 21, 23, respectively, and intervening dielectric or ferroelectric layers 12 and 22, respectively. FIG. 1B clearly shows that, by virtue of the formation of every second capacitor 20 on the rear side R of the wafer, with no loss of chip area, the capacitor area can be made larger than in conventional technology in which only the front side of the wafer is utilized. The capacitor 10 formed on the front side V extends so far in the lateral direction that it overlaps the selection transistor 3 of the next memory cell, which selection transistor is formed in the semiconductor layer 106. The same applies to the capacitor 20 which is formed from the rear side R and can extend in the lateral direction right into the vicinity of the next capacitor formed from the rear side R.

The enlarged illustration in FIG. 1B also shows the plugs 17 and 7 formed for the purpose of connecting the capacitor plates 11 and 21, respectively, to an n+-type transistor region of the selection transistors 2 and 3 situated in the semiconductor layer 106, of which plugs the plug 17 is formed from the front side V and the plug 7 is formed from the rear side R of the substrate wafer 1. Further plugs 5 serve for connecting the respective other transistor electrodes of the selection transistors 2 and 3 to a non-illustrated metallization plane containing the bit lines.

The proposed measure of forming every other storage capacitor 20 on the rear side of the substrate wafer 1 yields a larger bit line signal, which contributes to a further reduction of the area of the cell and increases the reliability of the memory product.

We claim:

1. An integrated semiconductor memory configuration, comprising:

a substrate having a front side and a rear side;

a plurality of memory cells each having a selection transistor and a storage capacitor connected to and addressible by said selection transistor;

said storage capacitors of respectively successive memory cells being formed alternately on said front side and said rear side of said substrate; and plugs formed on said rear side of said substrate, said plugs electrically connecting an electrode region of a respective said selection transistor with a capacitor plate, facing toward said selection transistor, of said storage capacitor disposed on said rear side of said substrate.

2. The integrated semiconductor memory configuration according to claim 1, wherein said memory cells are ferroelectric memory cells.

3. The integrated semiconductor memory configuration according to claim 1, wherein said memory cells are DRAM cells.

4. The integrated semiconductor memory configuration according to claim 1, wherein said rear side of said substrate is formed with a depression and an insulating layer formed in said depression, and wherein said storage capacitors formed on said rear side are disposed in said insulating layer and said insulating layer protects said storage capacitors from an influence of subsequent processes.

5. The integrated semiconductor memory configuration according to claim 1, wherein said selection transistors of said memory cells are CMOS transistors formed from said front side of said substrate wafer.

6. The integrated semiconductor memory configuration according to claim 1, wherein said storage capacitors formed on said front side of said substrate extend in a lateral direction to partly overlap a selection transistor of the adjacent said memory cell.

* * * * *